US012574031B2

(12) United States Patent
Scheiner et al.

(10) Patent No.: US 12,574,031 B2
(45) Date of Patent: Mar. 10, 2026

(54) CAPACITIVE SENSOR AND METHOD FOR PLANAR RECOGNITION OF AN APPROACH

(71) Applicant: Robert Bosch GmbH, Stuttgart (DE)

(72) Inventors: Philipp Scheiner, Weil der Stadt (DE); Susanne Fischer, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 229 days.

(21) Appl. No.: 17/861,481

(22) Filed: Jul. 11, 2022

(65) Prior Publication Data

US 2023/0024773 A1 Jan. 26, 2023

(30) Foreign Application Priority Data

Jul. 22, 2021 (DE) ..................... 10 2021 207 867.2

(51) Int. Cl.
| | |
|---|---|
| *H03K 17/955* | (2006.01) |
| *G01D 5/24* | (2006.01) |
| *G01R 27/26* | (2006.01) |
| *H03K 17/96* | (2006.01) |

(52) U.S. Cl.
CPC ......... *H03K 17/955* (2013.01); *G01D 5/2405* (2013.01); *G01R 27/2605* (2013.01); *H03K 17/962* (2013.01)

(58) Field of Classification Search
CPC ............... H03K 17/955; H03K 17/962; H03K 2217/960755; G01D 5/2405; G01R 27/2605; F16P 3/148
See application file for complete search history.

(56) References Cited

U.S. PATENT DOCUMENTS

| | | | | |
|---|---|---|---|---|
| 2011/0050256 A1* | 3/2011 | Frangen | ................... | F16P 3/148 |
| | | | | 324/681 |
| 2013/0342224 A1* | 12/2013 | Frangen | ............. | G01R 27/2605 |
| | | | | 324/658 |
| 2017/0257094 A1* | 9/2017 | Schupp | .................... | G01V 3/08 |

FOREIGN PATENT DOCUMENTS

| | | | |
|---|---|---|---|
| CN | 209602710 U | * | 11/2019 |
| DE | 102014218535 A1 | | 3/2016 |

* cited by examiner

*Primary Examiner* — Amy He
(74) *Attorney, Agent, or Firm* — NORTON ROSE FULBRIGHT US LLP

(57) ABSTRACT

A capacitive sensor for a planar recognition of an approach of an object. The capacitive sensor includes a first planar electrode and a second planar electrode, a dielectric being situated between the first electrode and second electrode for spacing. The first electrode and the second electrode being designed to be limp and/or torsion flexible.

13 Claims, 4 Drawing Sheets

CAPACITIVE SENSOR AND METHOD FOR PLANAR RECOGNITION OF AN APPROACH

CROSS REFERENCE

The present application claims the benefit under 35 U.S.C. § 119 of German Patent Application No. DE 10 2021 207 867.2 filed on Jul. 22, 2021, which is expressly incorporated herein by reference in its entirety.

FIELD

The present invention relates to a capacitive sensor for the planar recognition of an approach of an object, including a first and a second planar electrode which are spaced apart via a dielectric.

BACKGROUND INFORMATION

Proximity sensors, in particular capacitive proximity sensors, are used, for example, to recognize an approach of objects. Proximity sensors are used, for example, as the covering of machines or machine parts, specifically industrial robots, to equip them with sensory properties for recognizing their surroundings, in particular an approach.

For example, a capacitive sensor for the planar recognition of an approach of an object is described in German Patent Application No. DE 10 2014 218 535 A1, the capacitive sensor being made flexurally rigid and/or torsionally rigid.

SUMMARY

The present invention relates to a capacitive sensor for the planar recognition of an approach of an object. Furthermore, the present invention relates to a method for recognizing an approach of an object. Further exemplary embodiments, advantages, and effects result from the disclosure herein, including the description, and the figures.

In accordance with the present invention, a capacitive sensor is provided. The capacitive sensor is designed and/or configured to detect and/or recognize an approach of an object. The capacitive sensor is in particular made planar, specifically the capacitive sensor is designed to detect the approach of one or multiple object(s) in surroundings of the planar sensor.

In accordance with an example embodiment of the present invention, the capacitive sensor includes a first planar electrode and a second planar electrode. In particular, first and second planar electrode are electrically conductive surfaces adjoining one another and in particular electrically insulated from one another. The capacitive sensor furthermore includes a dielectric, the dielectric preferably being designed to be planar. The dielectric is in particular situated between first and second planar electrode, in particular to space them apart. The second planar electrode preferably includes at least two planar partial electrodes, specifically three or four planar partial electrodes. The first planar electrode specifically includes at least two planar partial electrodes. The planar partial electrodes of the second electrode are preferably situated laterally spaced apart and/or in a shared plane, in particular a textile layer or textile plane. In particular, the planar partial electrodes of the first electrode are situated laterally spaced apart and/or in a shared plane. The planar partial electrodes of the second planar electrode are referred to, for example, as A electrodes and B electrodes, the partial electrodes of the first electrode being referred to, for example, as C electrodes. The second electrode preferably includes two A electrodes and two B electrodes, the A electrodes forming, for example, a rectangular frame interrupted at diagonally opposing corner sections, the B electrodes forming two rectangular surfaces inside the frame, the rectangular surfaces describing, for example, two opposing quadrants of a Cartesian coordinate system.

The partial electrodes of the second electrode form at least one electrical capacitance, preferably in a second electrode including four partial electrodes, the partial electrodes form two electrical capacitances. The field lines of the capacitance, in particular of the capacitances, extend in the space between the particular partial electrodes, the field lines preferably extending at least partially in the surroundings of the capacitive sensor. In particular, air of the surroundings forms a dielectric of the electrical capacitance formed by the partial electrodes. The area of the surroundings including field lines of the electrical capacitance in particular forms a detection area. If the capacitance is charged and an object approaches, the field of the capacitance of the partial electrodes, in particular of the second electrode, is disturbed, for example by changing the spatial distribution of the field lines, so that a change of the value of the capacitance is measurable and the approach is detected. This has the advantage in particular that objects are already recognized in the event of an approach, without touching the sensor being necessary.

The first and the second planar electrode are designed to be limp, torsion flexible, and/or reversibly deformable. In particular, first and second planar electrode are designed to be flexible. The dielectric is particularly preferably limp, torsion flexible, flexible, and/or reversibly deformable. In particular, it is provided that the capacitive sensor itself, specifically in its entirety, is as far as possible and/or in sections designed to be limp, torsion flexible, reversibly deformable, flexible, and/or adaptable to a curved surface without great force effect, for example solely by human force. The provided capacitive sensor has the advantage that it is also adaptable and/or installable on non-planar surfaces, machines, and/or devices. For example, it is thus not necessary to attach a large number of flexurally rigid sensors to adapt to and cover a curved surface, but rather to be able to situate one continuous capacitive sensor in a precisely fitted manner. In particular, such sensors may be manufactured on a large scale and/or applied and/or used on a large scale. Furthermore, the provided capacitive sensor is particularly robust with respect to creasing and bending stresses. The sensor is particularly durable, which permits covering of machine parts particularly close to the contour and thus improves the informative value of the sensor signals.

Limp and/or torsion flexible and/or reversibly deformable is understood in particular to mean that the components or the material are dimensionally unstable and, for example, have a low modulus of elasticity and/or a low level of rigidity and in particular are already deformed as a result of low force stress. In particular, the limpness and/or the torsion flexibility is/are achieved by the use of the described materials.

One example embodiment of the present invention provides that the first electrode and/or the second electrode each include, have, and/or form a textile layer. The textile layer is, for example, a planar textile, the textile being flexible, limp, and/or torsion flexible. At least one electrode surface is situated on the textile layer. In particular, the electrode surfaces are applied to the textile layer, alternatively, the textile layer itself forms the electrode surface. The textile layer of the first electrode is preferably constructed identically and/or equivalently to the textile layer of the second electrode, alternatively the textile layers of first and second electrode are formed differently, for example, to achieve desired electrical and/or mechanical properties.

The first and/or the second textile layer is particularly preferably formed as a microfiber nonwoven material, preferably based on a polyester. The dimensional stability upon use in the capacitive sensor and good surface adhesion for electrode surfaces are particularly advantageous in the case of microfiber nonwoven material. Furthermore, the microfiber nonwoven material is distinguished by a low price and isotropic properties. Alternatively, the first and/or second textile layer is a textile product, in particular a woven fabric. In particular, the targeted introduction of different properties in the warp and/or weft is possible due to the use of a textile product and/or woven fabric, so that expanded usability of the capacitive sensor is made possible. The first and/or the second textile layer is specifically formed as a textile product in the form of a knitted fabric, the knitted fabric being accompanied by a particularly good elasticity for use in the capacitive sensor.

One example embodiment of the present invention provides that the first electrode and/or the second electrode, specifically the electrode surfaces, are based on a metal-coated textile and/or on an electrically conductive yarn. For example, the first electrode, second electrode, and specifically the electrode surfaces are formed as part of the textile, for example, the textile layer, in particular a surface, being metal-coated. For example, the electrode is formed as a silver-coated textile layer. The first and/or second electrode is particularly preferably formed as a silver-coated polyamide woven fabric, which is distinguished by good processability, dimensional stability, and crease resistance. Furthermore, the coated woven fabric and/or the metal-coated textile layer is/are in particular made so it may be trimmed and/or laminated by laser. In particular, the electrode surfaces may be formed from a conductive thread material, for example, by embroidery using the conductive thread material, which is accompanied by the advantage that the electrical properties are deliberately positionable.

One example embodiment provides that the first and/or the second electrode, in particular the textile layers and electrode surfaces, form a conductive textile product based on a metal-coated textile fiber, the textile fibers in particular being processed so that they form the electrode surface. Such a planar electrode may be laminated particularly well and may be processed by embroidery. Alternatively and/or additionally, the first and/or second electrode, in particular the textile layer and/or electrode surface, may form a conductive textile product made of metal fibers, the metal fibers being processed at the end to form the textile product and forming the textile surface. This textile product may in particular form a woven fabric, a nonwoven material, or a knitted fabric. The electrode surfaces may specifically be printed onto the textile layer, for example, by printing conductive printing paste and/or conductive ink.

In accordance with an example embodiment of the present invention, it is optionally provided that the capacitive sensor includes a device side and a surroundings side, device side and surroundings side in particular being oriented in two directions facing away from one another and/or in opposite directions. The device side is designed in particular to be situated on the device, for example a robot. The surroundings side is in particular the side of the capacitive sensor which is oriented toward the surroundings and/or is located closest to the object to be recognized. The first electrode is in particular situated on the device side with respect to the dielectric, the second electrode being situated with respect to the dielectric on the surroundings side and/or toward the surroundings side. The first electrode in particular forms a shielding electrode in relation to the device, for example, against device electronics located underneath. The second electrode in particular forms a transmitting and/or a receiving electrode, in particular for establishing and/or detecting the object which is approaching and/or is located in the surroundings.

The dielectric is particularly preferably designed to be limp, torsion flexible, elastic, reversibly deformable, and/or soft. For example, the dielectric forms and/or includes a spacer knit, a spacer fabric, felt, or foam. Particularly good pressure stability and good processability using textile methods, for example, by embroidery, is advantageous for the use of a spacer knit. Furthermore, the spacer knit is particularly light, so that capacitive sensors including low weight are producible. The dielectric is, for example, made of a foam, this in particular forming a closed structure due to closed pores and thus having particularly good dielectric properties. Furthermore, the dielectric may be formed as a spacer fabric, additional electronic and/or further properties being deliberately introducible due to the use of a spacer fabric.

One example embodiment of the present invention provides that the capacitive sensor includes an electronics module. In particular, the electronics module forms a module that is situated on the device side with respect to the dielectric and/or the first electrode. The electronics module in particular includes a plurality of electronic components and an electronic carrier. The electronics module is designed, for example, for activation, data acquisition, data processing, and/or power supply or interface to the power supply. The electronic components are in particular designed to be flexurally rigid, alternatively the electronic components may be designed to be limp and/or torsion flexible. The electronic components form, for example, electronic parts, microcontrollers, processors, memories, or the like. The electronic components are situated on the electronic carrier, in particular, the electronic components are electrically connected to one another, the electrical connection in particular taking place within the electronic carrier and/or on the electronic carrier. The electronic carrier is preferably a PCB, FPCB, a textile carrier, and/or a film-like carrier. In particular, the electronic carrier is designed to be limp, torsion flexible, reversibly deformable, flexible, and/or elastic.

In particular, it is provided that the first electrode is connected to the dielectric and/or the second electrode is connected to the dielectric with the aid of a layer connection. In particular, the layer connection connects electrode and dielectric in each case in such a way that they may not shift in relation to one another, are held together, and/or are fixedly positioned in relation to one another. The layer connection is, for example, a permanent connection, in particular a non-displaceable connection and/or integrally-joined connection. The layer connection may be formed, for example, by lamination, embroidery, and/or adhesive bonding.

For example, a lamination film is used for lamination, the lamination film in particular being situated between dielectric and electrode, specifically between dielectric and electrode surface. In particular, the lamination is formed as a full-surface lamination of the electrode and/or electrode surface. This is advantageous in particular since no cuts take place during the connection and these surfaces or layers are situated and/or remain in parallel. In particular, this connection is particularly stable, so that no unexpected detachment of the layers is to be expected in comparison to punctiform connections. The layer connection may be formed in particular based on a hot-melt adhesive yarn, the hot-melt adhesive yarn having been embroidered, for example, and subsequently forming the final connection in a lamination process. The hot-melt adhesive yarn is applied in the embroidery process and subsequently laminated, so that work steps may be saved in comparison to other connection options. Alternatively, the layer connection is formed based on a punctiform application of adhesive, in particular hot-melt adhesive. In particular, the punctiform application permits particularly good draping capability. Alternatively and/or additionally, the layer connection is formed by a standard embroidery yarn, for example, stitch lines being embroidered through all layers, for example, similarly to a quilt. Alternatively, the layer connection may be formed as a planar application of adhesive, in particular hot-melt adhesive, and thus the adhesive bonding of dielectric and electrode. In particular, the planar application of adhesive and/or hot-melt adhesive is particularly cost-effective.

In particular, it is provided that the capacitive sensor includes strip conductors. The strip conductors are formed to connect the first electrode and/or the second electrode to the electronics module and/or externally. In particular, the strip conductors extend through multiple layers and/or plies of the capacitive sensor. In particular, the strip conductors are provided for detecting the capacitance change. The electrical strip conductors are based on an electrical conductor and/or form an electrical conductor, the electrical conductor being designed to be processable and/or embroiderable as a textile. For example, the electrical conductor is formed as a yarn, particularly preferably the electrical conductor is formed as a metal-coated yarn, in particular a silver-coated yarn. Metal-coated polyamide yarns, specifically silver-coated polyamide yarn, are particularly preferred. In particular, a good textile processability and a particularly textile behavior (i.e., not rigid or brittle) in use recommends metal-coated yarn. Alternatively and/or additionally, the electrical conductor is formed as a yarn including a metallic filament. The electrical conductor may be formed in particular as a metal fiber yarn.

A method for detecting and/or recognizing an approach of an object, in particular using the capacitive sensor, forms a further subject matter of the present invention. In accordance with an example embodiment of the present invention, the method provides that a first planar electrode and a second planar electrode are spaced apart with the aid of a planar dielectric, alternatively a punctiform dielectric. The first planar electrode preferably includes at least two planar partial electrodes. The first electrode and the second electrode spaced apart by the dielectric in particular form a capacitance. In particular, first electrode, second electrode, and/or dielectric are designed to be limp and/or torsion flexible. Upon approach of an object to the capacitive sensor, a change of the capacitance is established and the approach of the object is detected.

Further advantages, effects, and embodiments of the present invention result from the figures and their description.

DETAILED DESCRIPTION OF EXAMPLE EMBODIMENTS

Figure 1:
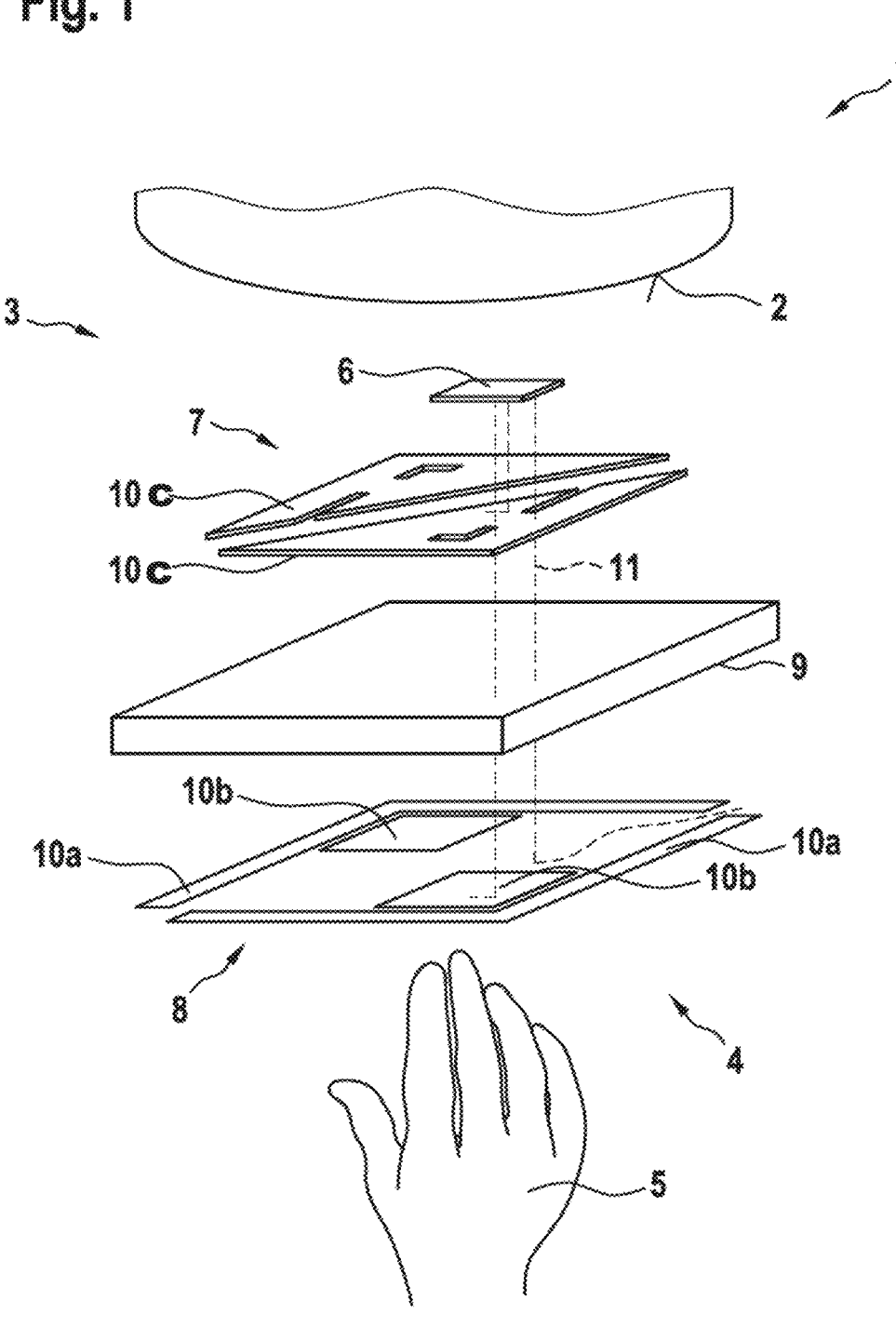
FIG. 1 shows a schematic structure of a capacitive sensor, in accordance with an example embodiment of the present invention.

FIG. 1 shows an exemplary embodiment of a capacitive sensor 1. Capacitive sensor 1 is in particular designed to be planar and to be situated on a curved surface 2, for example, a device surface or a robot surface. Sensor 1 in particular includes a device side 3, device side 3 being formed to be situated and/or fastened on surface 2. Capacitive sensor 1 is in particular designed to be limp, torsion flexible, drapable, reversibly deformable, and/or flexible. In particular, the capacitive sensor includes a textile behavior and/or textile properties. Capacitive sensor 1 in particular forms a textile sensor. Capacitive sensor 1 includes a surroundings side 4, surroundings side 4 being oriented toward the surroundings. For example, the approach of a hand as object 5 to the sensor or surface 2 is establishable and/or detectable by capacitive sensor 1, in particular by measuring a changed capacity of capacitive sensor 1. Capacitive sensor 1 includes an electronics module 6, electronics module 6 including electronic components, for example, processors, memories, or functional modules, which are situated on a classic carrier (circuit board or flexible circuit board).

Capacitive sensor 1 includes a first electrode 7 and a second electrode 8, which are spaced apart via a dielectric 9. First electrode 7 in particular includes two partial electrodes 10c, second electrode 8 including four partial electrodes 10a, b. First electrode 7 is situated on the side of surface 2 with respect to dielectric 9, second electrode 8 being oriented toward surroundings 5 with respect to dielectric 9. First electrode 7 and second electrode 8 include textile properties and/or in particular form textile electrodes, these electrodes being fixedly connected to dielectric 9 with the aid of a layer connection. Furthermore, capacitive sensor 1 includes strip conductors 11, strip conductors 11 being embroidered from an electrically conductive yarn. Strip conductors 11 extend in particular through layers and/or plies of capacitive sensor 1, for example, second electrode 8 is connected to the electronics module through the other parts with the aid of strip conductors 11.

Figure 2:
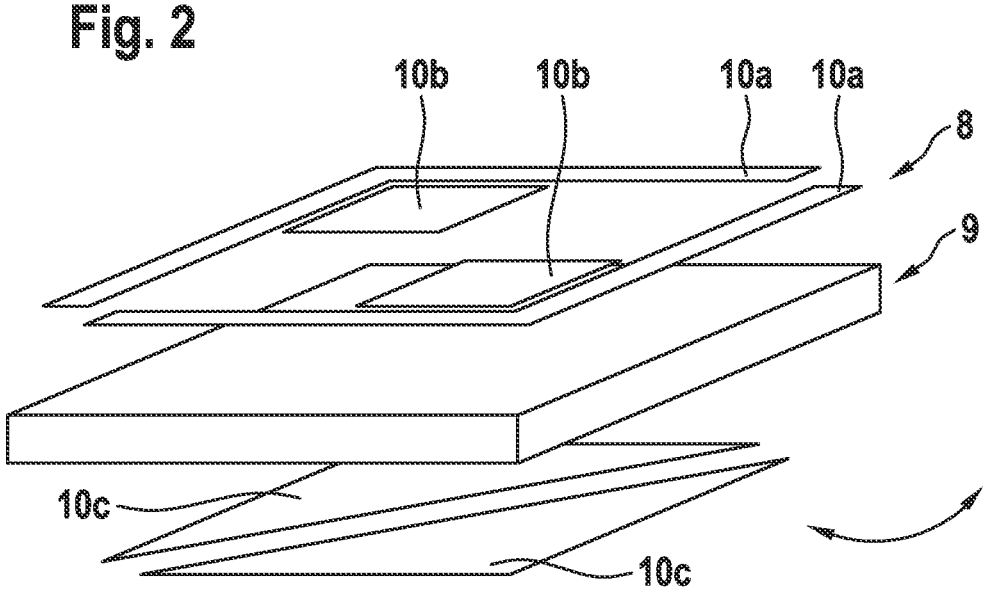
FIG. 2 shows a detail of a capacitive sensor including partial electrodes, in accordance with an example embodiment of the present invention.

FIG. 2 shows by way of example a detail of a capacitive sensor 1. The capacitive sensor includes a first electrode 7 and a second electrode 8. First electrode 7 includes two partial electrodes 10c. Second electrode 8 includes four partial electrodes 10a and 10b. Partial electrodes 10a, b, c each form electrically conductive surfaces. Partial electrodes 10a form a rectangular frame, partial electrodes 10b being situated inside the frame. Partial electrodes 10a each include two legs, which are at right angles to one another. Partial electrodes 10b form rectangular surfaces, in particular square surfaces. Partial electrodes 10b are diagonally spaced apart inside the frame.

Figure 3A:
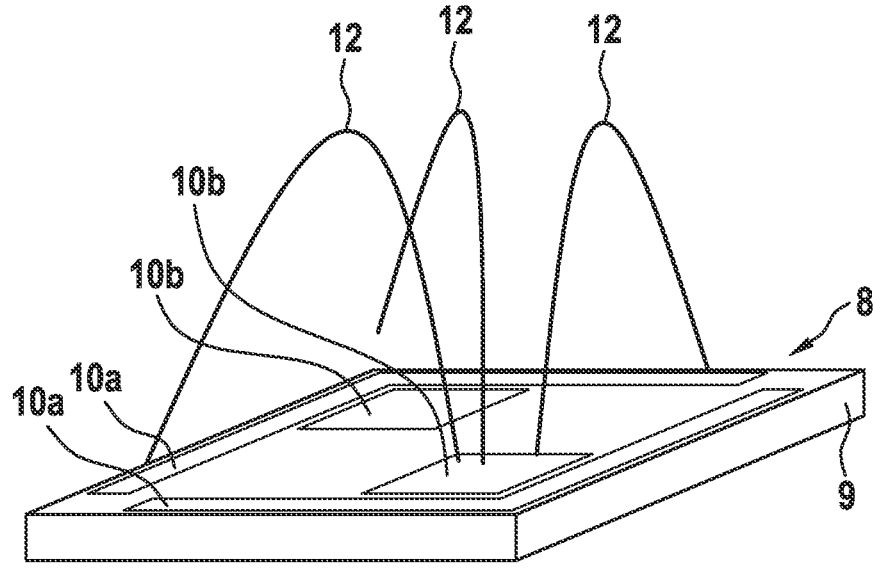
FIGS. 3A and 3B show an electrical field between partial electrodes without and with object approach.

In each case one partial electrode 10a forms a capacitance with one, in particular the more remote, partial electrode 10b, so that two capacitances formed from four partial electrodes 10a, b result. After application of a voltage between partial electrodes 10a, b of the two capacitances, an electrical field including field lines 12 forms between them. It is preferably provided that the electrical field of the two capacitances is formed alternating over time. In one variant, it is provided that the electrical field of the two capacitances is formed at the same time. Upon approach of an object 5, the capacitance changes so that the approach of object 5 is detected. It is not necessary for object 5 to touch capacitive sensor 1, rather the change of the capacitance already occurs upon an approach of object 5. FIG. 3A shows the detail of capacitive sensor 1 from FIG. 2. In this case, field lines 12 of the electrical field of the capacitance formed by second electrode 2, in particular partial electrodes 10*a, b*, are shown by way of example. Field lines 12 extend in the surroundings, in particular surroundings air and/or the detection area.

Figure 3B:
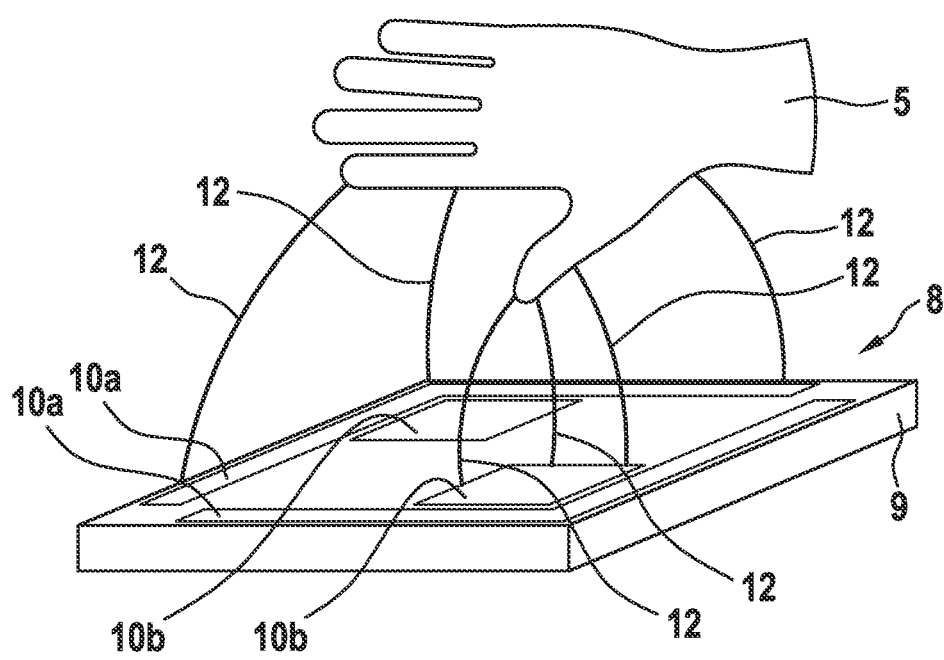

FIG. 3B shows the detail of capacitive sensor 1 from FIG. 2 and FIG. 3A. In contrast to FIG. 3A, an object 5 is situated here in the surroundings or in the detection area. Object 5 changes the profile of field lines 12 of the electrical field of the capacitance of second electrode 8. This change of the electrical field is accompanied by a measurable change of the capacitance, so that object 5 may already be detected upon its approach due to the disturbance of the electrical field.

Figure 4A:
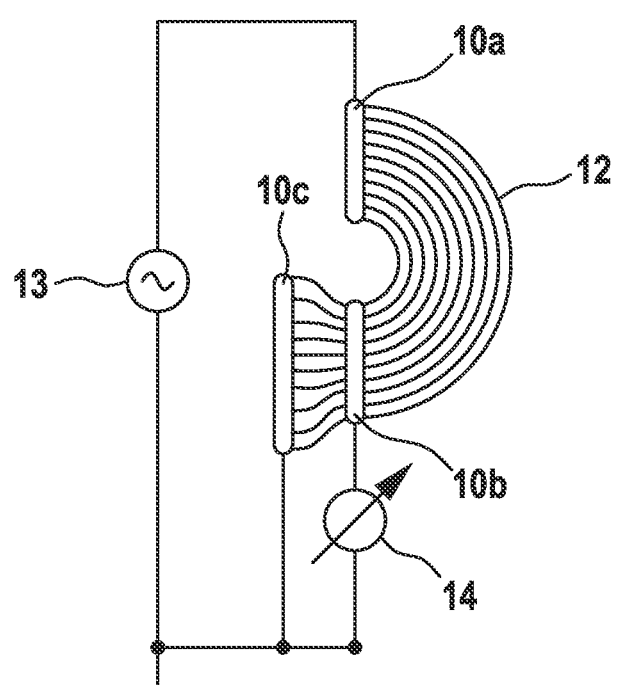
FIGS. 4A and 4B show a field line profile of a capacitive sensor with and without object approach according to FIGS. 3A and 3B.
Figure 4B:
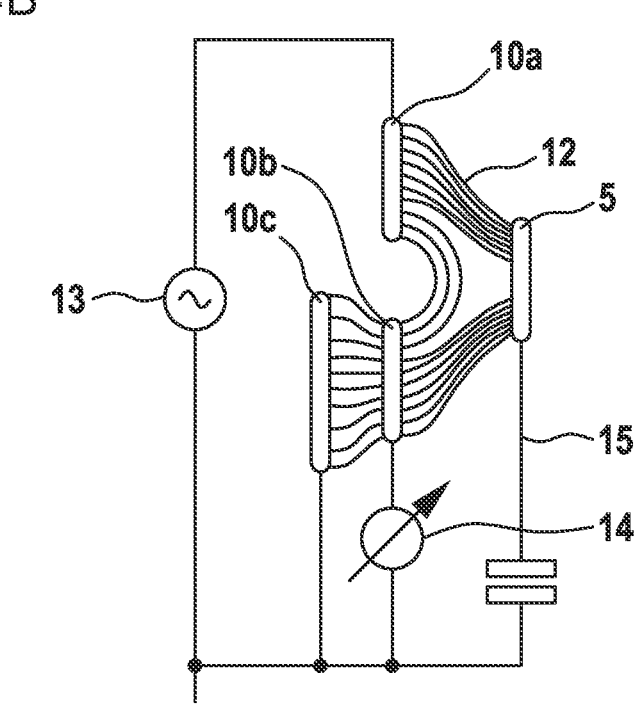

FIGS. 4A and 4B schematically show the profile of field lines 12 between object 5, first and second electrode 7, 8, and partial electrodes 10*a, b, c*. FIG. 4A shows the situation according to FIG. 3A without object 5 and FIG. 4B shows the situation according to FIG. 3B with object 5. Furthermore, an exemplary embodiment of a circuit structure for measuring the capacitance change is shown. A voltage source 13, in particular an AC voltage source, and a voltage meter 14 are provided for this purpose. For object 5, an equivalent circuit branch 15 is shown in FIG. 4B to illustrate the capacitance change due to object 5.

What is claimed is:

1. A capacitive sensor for planar recognition of an approach of an object, the capacitive sensor comprising:
   a first planar electrode;
   a second planar electrode;
   a dielectric situated between the first electrode and second electrode for spacing;
   wherein the first electrode and the second electrode are limp or torsion flexible, wherein: (i) the dielectric is limp, and (ii) the dielectric forms a spacer knit or a spacer fabric or spacer felt or spacer foam;
   an electronics module including electronic components and an electronic carrier, the electronic components being situated on the electronic carrier, the electronic carrier forming a flexible circuit board including vias; and
   a conductive yarn for achieving an embroidery fastening and contacting with the flexible circuit board.

2. The capacitive sensor as recited in claim 1, wherein the first planar electrode or the second planar electrode each include a first partial electrode and a second partial electrode, the first and the second partial electrodes each being situated laterally spaced apart and forming electrical capacitances isolated from one another in such a way that a value of a capacitance of the capacitive sensor changes upon approach of an object.

3. The capacitive sensor as recited in claim 2, wherein the second electrode includes a third and a fourth partial electrode, the first, second, third, and fourth partial electrodes being interconnected in such a way that they form at least two electrical capacitances, the first, second, third, and fourth partial electrode being situated in such a way that detection areas of two electrical capacitances formed by electrical field lines at least partially overlap.

4. The capacitive sensor as recited in claim 1, wherein the first electrode or the second electrode each include a textile layer, wherein: (i) an electrode surface is situated on the textile layer, or (ii) the textile layer includes or forms an electrode surface.

5. The capacitive sensor as recited in claim 4, wherein the textile layer forms a microfiber nonwoven material.

6. The capacitive sensor as recited in claim 1, wherein electrode surfaces of the first electrode or the second electrode form: (i) a metal-coated textile, or (ii) a textile based on electrically conductive yarn.

7. The capacitive sensor as recited in claim 1, wherein the capacitive sensor includes a device side to be situated on a surface and a surroundings side for recognizing the object, the first electrode being situated on the device side with respect to the dielectric and the second electrode being situated on the surroundings side with respect to the dielectric, the first electrode forming a shielding electrode.

8. The capacitive sensor as recited in claim 1, wherein the first electrode and the second electrode are each connected to the dielectric using a layer connection, the layer connection forming a permanent connection, or non-displaceable connection, or integrally-joined connection.

9. The capacitive sensor as recited in claim 8, wherein the layer connection is based on a lamination or an embroidery or adhesive bonding.

10. The capacitive sensor as recited in claim 1, further comprising:
   strip conductors, the strip conductors electronically connecting each of the electrodes to an electronics module or externally, the strip conductors being based on an electrical conductor, the electrical conductor being processable or embroiderable.

11. The capacitive sensor as recited in claim 10, wherein the electrical conductor forms a metal-coated yarn.

12. A method for recognizing an approach of an object, the method comprising:
   providing a capacitive sensor including a first planar electrode and a second planar electrode, the first planar electrode and the second planar electrode being situated spaced apart from one another using a dielectric, the first electrode and the second electrode being limp or torsion flexible, wherein: (i) the dielectric is limp, and (ii) the dielectric forms a spacer knit or a spacer fabric or spacer felt or spacer foam;
   recognizing the approach of the object using the capacitive sensor;
   providing an electronics module including electronic components and an electronic carrier, the electronic components being situated on the electronic carrier, the electronic carrier forming a flexible circuit board including vias; and
   providing a conductive yarn for achieving an embroidery fastening and contacting with the flexible circuit board.

13. A capacitive sensor for planar recognition of an approach of an object, the capacitive sensor comprising:
   a first planar electrode;
   a second planar electrode;
   a dielectric situated between the first electrode and second electrode for spacing;
   wherein the first electrode and the second electrode are limp or torsion flexible, wherein: (i) the dielectric is limp, and (ii) the dielectric forms a spacer knit or a spacer fabric or spacer felt or spacer foam, wherein the first electrode or the second electrode each include a textile layer, wherein: (i) an electrode surface is situated on the textile layer, or (ii) the textile layer includes or forms an electrode surface;

an electronics module including electronic components and an electronic carrier, the electronic components being situated on the electronic carrier, the electronic carrier forming a flexible circuit board including vias; and a conductive yarn for achieving an embroidery fastening and contacting with the the flexible circuit board.

* * * * *